(12) United States Patent
Xiong et al.

(10) Patent No.: US 10,304,888 B2
(45) Date of Patent: May 28, 2019

(54) IMAGING APPARATUS COMPRISING 3D STACKED GLOBAL SHUTTER

(71) Applicant: SmartSens Technology (Cayman) Co. Ltd., Grand Cayman (KY)

(72) Inventors: Zhibin Xiong, San Francisco, CA (US); Chen Xu, Santa Clara, CA (US); Zexu Shao, Shanghai (CN)

(73) Assignee: SmartSens Technology (Cayman) Co. Ltd., Grand Cayman (KY)

( * ) Notice: Subject to any disclaimer, the term of this patent is extended or adjusted under 35 U.S.C. 154(b) by 0 days.

(21) Appl. No.: 15/335,650

(22) Filed: Oct. 27, 2016

(65) Prior Publication Data

US 2017/0048469 A1    Feb. 16, 2017

(30) Foreign Application Priority Data

May 11, 2016    (CN) .......................... 2016 1 0310694

(51) Int. Cl.
*H01L 27/146*    (2006.01)
*H04N 5/369*    (2011.01)
*H04N 5/3745*    (2011.01)
*H04N 5/357*    (2011.01)
*H04N 9/04*    (2006.01)

(52) U.S. Cl.
CPC .. *H01L 27/14636* (2013.01); *H01L 27/14634* (2013.01); *H04N 5/3575* (2013.01); *H04N 5/379* (2018.08); *H04N 5/3745* (2013.01); *H04N 5/37452* (2013.01); *H04N 9/045* (2013.01); *H01L 27/14609* (2013.01); *H01L 27/14645* (2013.01)

(58) Field of Classification Search
CPC .............. H01L 27/14636; H04N 9/045; H04N 5/37452
See application file for complete search history.

(56) References Cited

U.S. PATENT DOCUMENTS

| 2014/0008520 | A1* | 1/2014 | Raynor | H01L 27/14612 250/208.1 |
| 2015/0179693 | A1* | 6/2015 | Maruyama | H01L 27/14636 257/435 |
| 2017/0104946 | A1* | 4/2017 | Hong | H04N 5/374 |

* cited by examiner

*Primary Examiner* — Christopher K Peterson
(74) *Attorney, Agent, or Firm* — George Wang; Eric Karich

(57) ABSTRACT

The present invention relates to an imaging apparatus, which comprises: a pixel array, comprising a plurality of pixels arranged in rows and columns, wherein at least one of the pixels comprises: a first capacitor configured to store a reset signal, and a second capacitor configured to store a pixel signal; a plurality of column circuits, wherein at least one of the column circuits reads the reset signal from the first capacitor, reads the pixel signal from the second capacitor, and generates difference between the reset signal and the pixel signal, wherein the pixel is configured to store the pixel signal to the second capacitor after the reset signal is stored to the first capacitor.

7 Claims, 8 Drawing Sheets

IMAGING APPARATUS COMPRISING 3D STACKED GLOBAL SHUTTER

CROSS-REFERENCE TO RELATED U.S. APPLICATIONS

This application claims benefit of priority under the Paris Convention based on Chinese Application No. 201610310694.8 filed on May 11, 2016, the entire disclosures of which is incorporated herein by reference.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention relates to the field of imaging technology, particularly to an imaging apparatus.

BACKGROUND OF THE INVENTION

CMOS image sensors have been widely used in various products such as cell phones, tablet computers, security monitoring systems and the like. In many applications such as industrial camera, machine vision and the like, it needs to capture the objects moving at high speed without distortion, due to the high speed motion of the object and the requirements of image recognition algorithm. Traditional CMOS image sensors with rolling shutter, which read progressively, can generate Jell-O effect on objects moving at high speed and the image may be distorted, and therefore, it is required to use a global shutter.

Advantageously, the present invention provides a solution that can solve this problem.

SUMMARY OF THE INVENTION

One aspect of the present invention provides an imaging apparatus. The apparatus comprises a pixel array comprising a plurality of pixels arranged in rows and columns, wherein at least one of the pixels comprises: a first capacitor configured to store a reset signal, and a second capacitor configured to store a pixel signal; a plurality of column circuits, wherein at least one of the column circuits reads the reset signal from the first capacitor, reads the pixel signal from the second capacitor, and generates difference between the reset signal and the pixel signal.

In the aforementioned imaging apparatus, the pixel is configured to store the pixel signal to the second capacitor after the reset signal is stored to the first capacitor.

In the aforementioned imaging apparatus, the pixel further comprises an output transistor connected between an output transistor of the pixel and the ground.

In the aforementioned imaging apparatus, the pixel further comprises an output source follower transistor connected to an output of the first capacitor and the second capacitor and a row selection transistor.

In the aforementioned imaging apparatus, the pixel comprises a first spacing layer, a first wafer, a second spacing layer and a second wafer sequentially.

In the aforementioned imaging apparatus, the pixel comprises a plurality of micro lens located on the first spacing layer.

In the aforementioned imaging apparatus, the first wafer includes a plurality of photodiodes, and the second wafer comprises at least part of circuit of the pixel.

In the aforementioned imaging apparatus, the second wafer comprises the first capacitor and the second capacitor.

In the aforementioned imaging apparatus, the second spacing layer comprises a pixel inner-connection structure that electrically connects the at least one of the photodiodes located in the first wafer with the at least part of circuit of the pixel located in the second wafer.

In the aforementioned imaging apparatus, the first spacing layer comprises a plurality of filters, at least one of which is located between the micro lens and the photodiode.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

Figure 1:
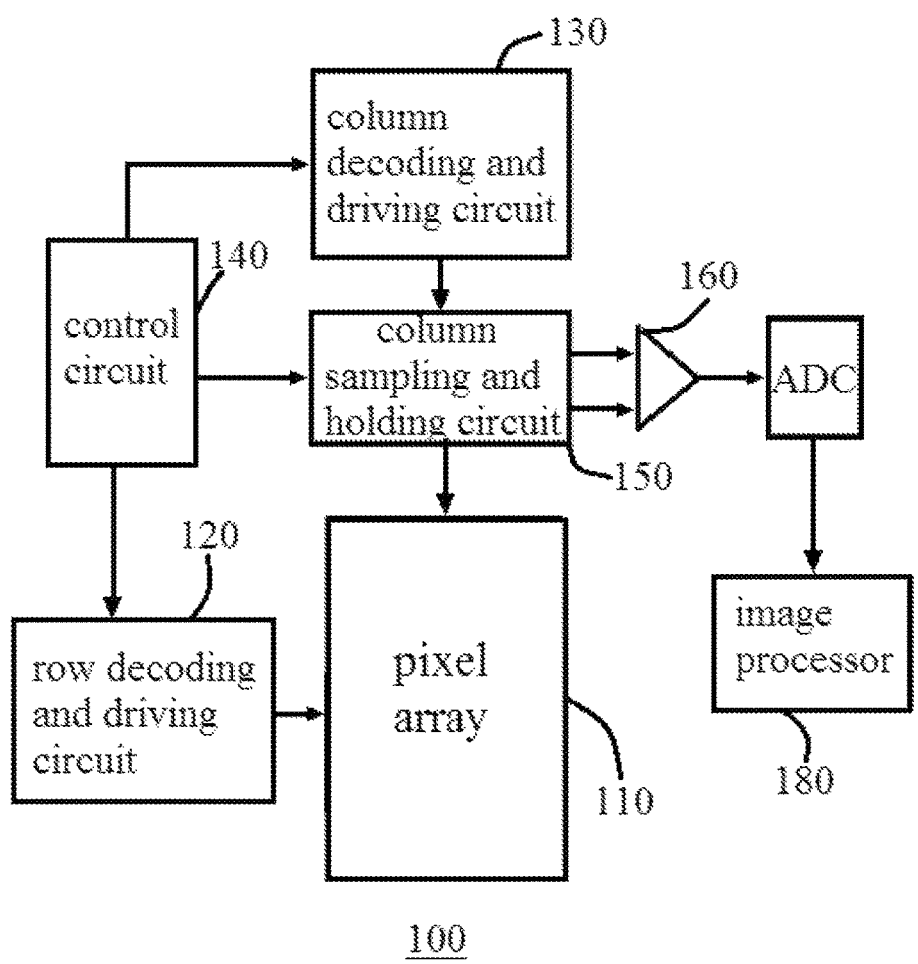
FIG. 1 shows a schematic diagram of the structure of an imaging apparatus.

To make the objects, technical solutions and advantages of the embodiments of the present invention more clearly, the technical solutions of embodiments of the present invention will now be clearly and fully described with reference to the accompanying drawings. It is apparent, however, that only some, and not all, of the embodiments of the present invention are described. Based on the embodiments of present invention, all the other embodiments that a skilled person would arrive at without inventive efforts shall fall within the scope of protection of the present invention.

In the following detailed description, reference can be made to the accompanying drawings, which as part of the present application serve to illustrate particular embodiments of the present application. In the drawings, like reference numerals refer to generally similar elements. Various particular embodiments of the present application have been described, to such sufficient detail that a person of ordinary skill with relevant knowledge and technique in the art can practice the technical solution of the present application. It should be understood that other embodiments can be used, or that structural, logical or electrical changes can be made to the embodiments of the present application.

Figure 2:
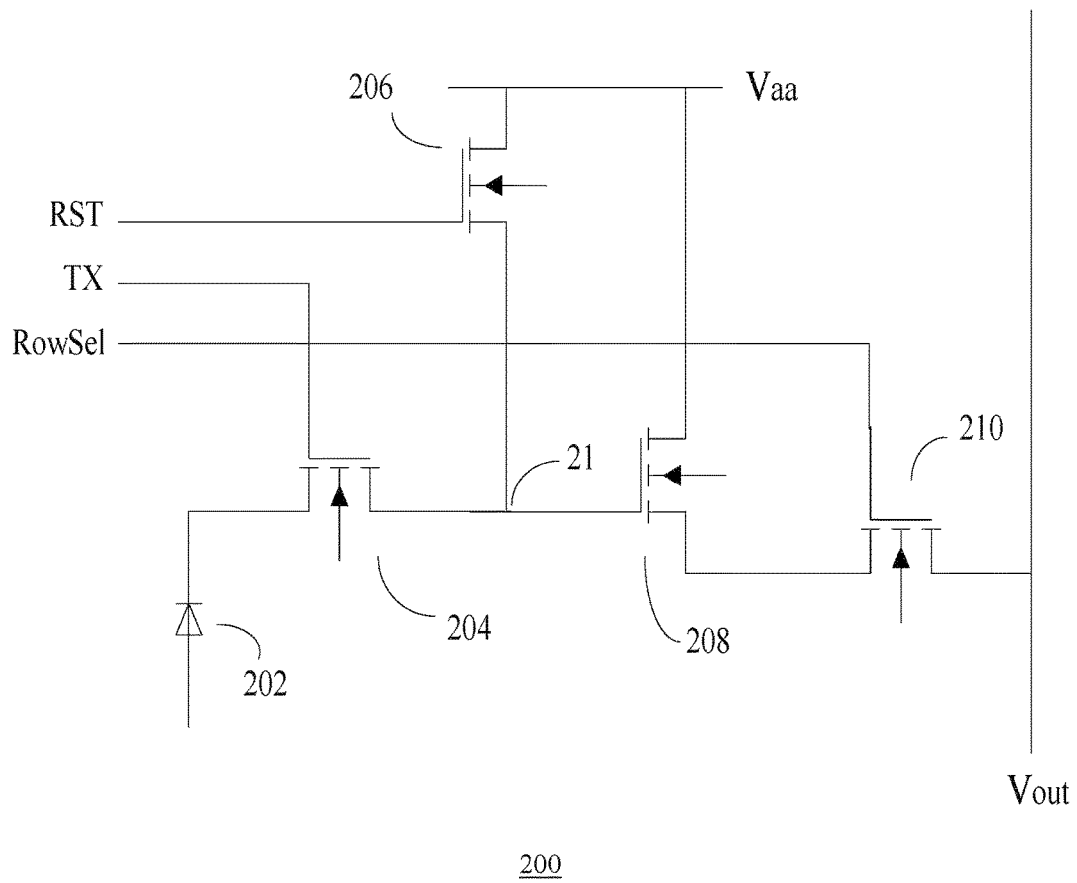
FIG. 2 schematically illustrates a representative pixel structure.

The term pixel refers to an electrical element comprising an optic sensor or other devices for converting electromagnetic signals into electric signals. For purpose of illustration, FIG. 1 illustrates a representative imaging apparatus, which includes one pixel array. FIG. 2 illustrates a representative pixel, and all pixels in a pixel array are typically fabricated in a similar way.

FIG. 1 schematically shows the structure of an imaging apparatus 100. The imaging apparatus 100 such as a CMOS imaging apparatus, comprises a pixel array 110. The pixel array 110 comprises a plurality of pixels arranged in rows and columns. The pixels in each column of the pixel array 110 are gated simultaneously by a column selection line, and the pixels in each row are selectively output by a row selection line, respectively. Each of the pixels has a row address and a column address. The column address of the pixels corresponds to the column selection line driven by a column decoding and driving circuit 130, and the row address of the pixels corresponds to the row selection line driven by a row decoding and driving circuit 120. A control circuit 140 controls the column decoding and driving circuit 130 and the row decoding and driving circuit 120, so as to selectively read out the pixel output signal corresponding to a proper row or column in the pixel array.

The pixel output signal comprises a pixel reset signal $V_{rst}$ and a pixel image signal $V_{sig}$. The pixel reset signal $V_{rst}$ represents the signal obtained from a floating diffusion region when the floating diffusion region of the optic device (such as a photodiode) is reset. The pixel image signal $V_{sig}$ represents a signal obtained from the charge of the representative image obtained by the optic device transferring to the floating diffusion region. The pixel reset signal $V_{rst}$ and the pixel image signal $V_{sig}$ are both read out by the column sample and hold circuit 150, and performs subtraction through the differential amplifier 160. The signal $V_{rst}-V_{sig}$ outputted from the differential amplifier 160 represents the image signal obtained by the optic device. The image signal is converted into a digital signal through an AD converter ADC 170, and further processed by image processor 180 to output a digitized image.

FIG. 2 is a schematic diagram illustrating a representative pixel structure. The pixel 200 in FIG. 2 comprises a photodiode 202, a transfer transistor 204, a reset transistor 206, a source follower transistor 208 and a row selection transistor 210. The photodiode 202 is connected to the source of transfer transistor 204. The transfer transistor 204 is controlled by a signal TX. When TX controls the transfer transistor to be in an 'on' state, the charges accumulated in the photodiode are transferred to the storage area 21. Meanwhile, the photodiode 202 is reset. The gate of the source follower transistor 208 is connected to the storage area 21. The source follower transistor 208 amplifies the signal received from storage area 21. The source of the reset transistor 206 is also connected to the storage area 21. The reset transistor 206 is controlled by a signal RST for resetting the storage area 21. The pixel 200 further comprises the row selection transistor 210. The row selection transistor 210 is controlled by a signal RowSel, and outputs the signal amplified by source follower transistor 208 to an output line Vout.

Figure 3:
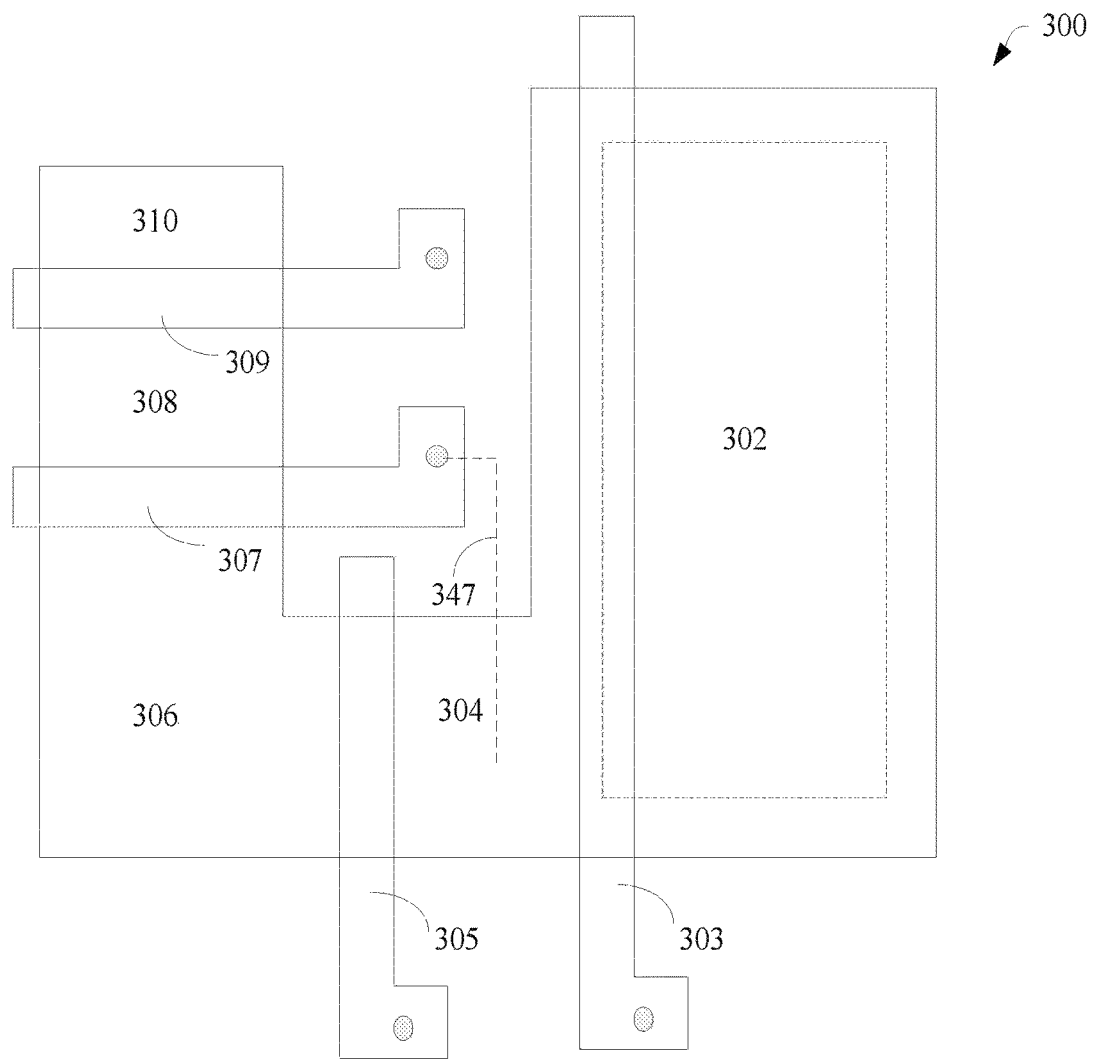
FIG. 3 illustrates another representative pixel structure.

FIG. 3 is also a schematic diagram illustrating a representative pixel structure. FIG. 3 is not a schematic diagram of abstract circuit logic relation, but a schematic diagram of specific structure of semiconductor. The pixel 300 in FIG. 3 comprises a photodiode 302 as an optic device. The pixel 300 comprises a transfer gate 303, which forms a transfer transistor with a photodiode 302 and a storage area, i.e. a floating diffusion region 304. The pixel 300 also comprises a reset gate 305, which is connected between the floating diffusion region 304 and an active area 306, for resetting the floating diffusion region 304. The active area 306 is connected to a voltage source Vaa. The pixel 300 also comprises a source follower gate 307, which is connected between the active areas 306 and 308 to form a source follower transistor, and the source follower gate 307 is electrically coupled to the floating diffusion region 304 through an electric connection structure 347. The pixel 300 further comprises a row selection transistor gate 309, which is connected between the active area 308 and the active area 310 as a pixel output port to form a row selection transistor.

The source area/drain area, the floating diffusion region, the channel area located at the next stage of the gate between the source/drain area of the above transistors and the photodiodes are defined as the active area due to their doping, which defines the active electric apparatus in combination with the gate structure.

In view of the problems existing in the prior arts, a circuit structure based on column parallel reading structure is provided in the present invention.

Figure 4:
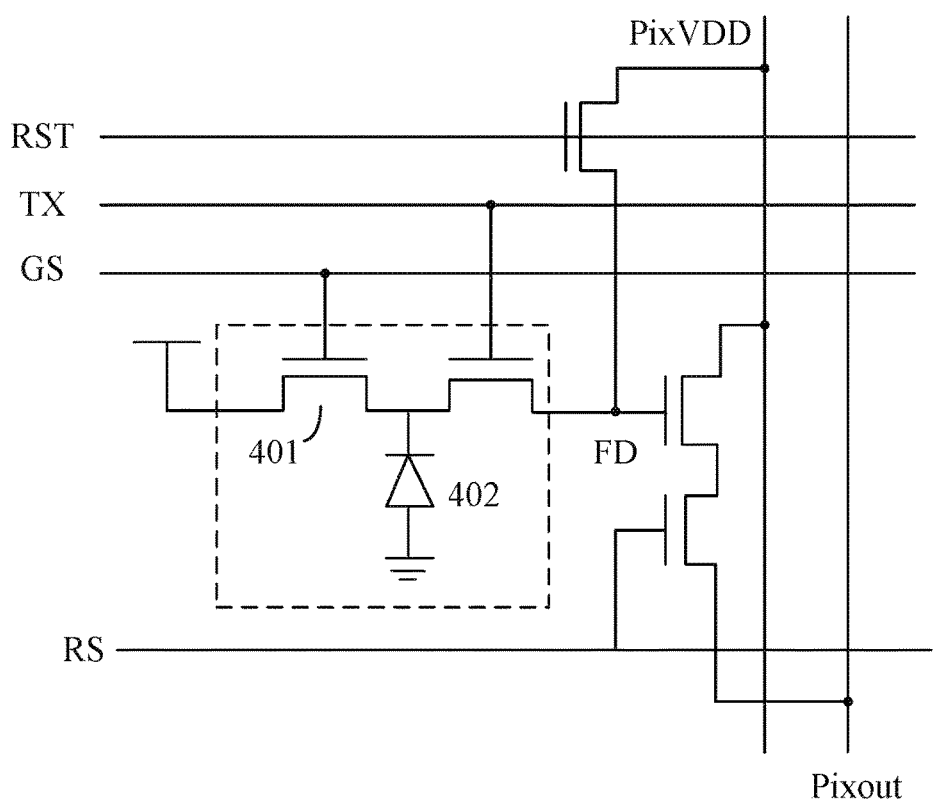
FIG. 4 is a schematic diagram of a pixel structure of an image sensor with global shutter in prior art.
Figure 5:
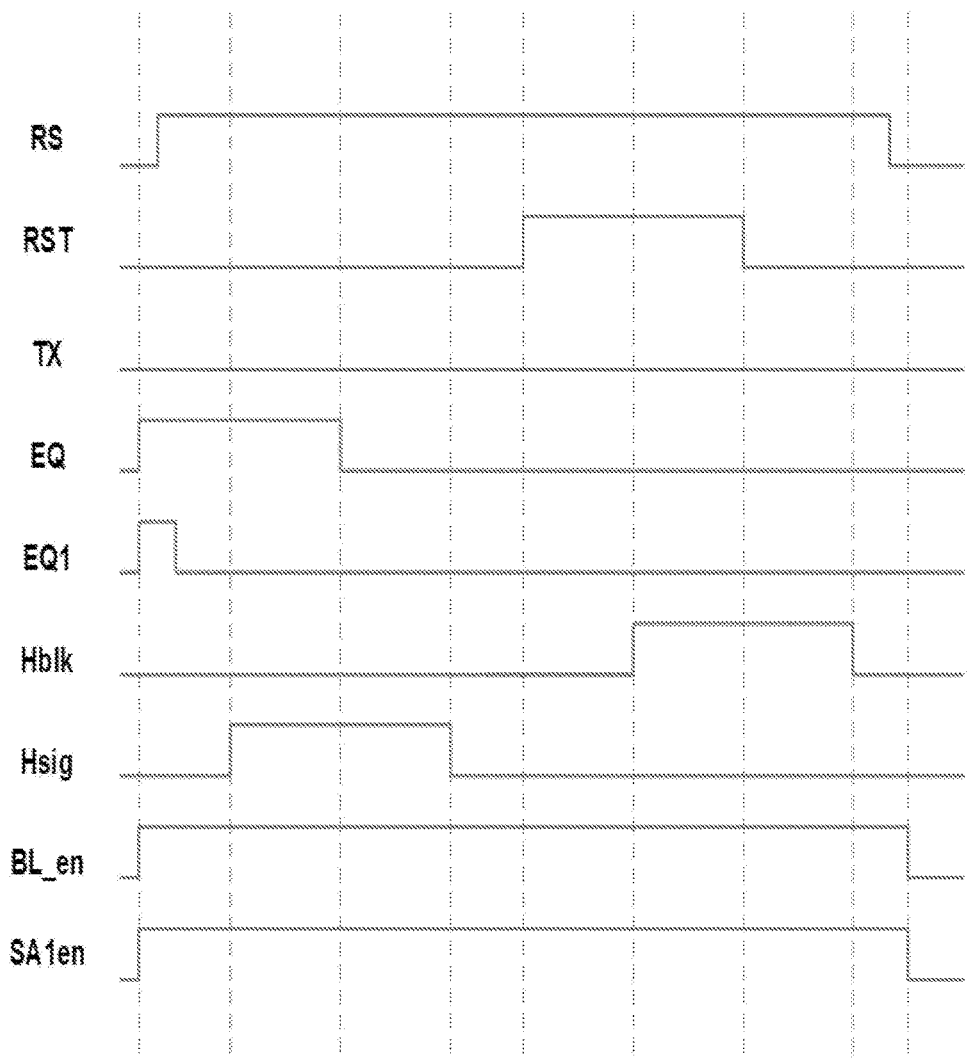
FIG. 5 illustrates a timing chart of signal read-out of the image sensor with global shutter in prior art.

FIG. 4 is a schematic diagram of a pixel structure of an image sensor with global shutter of prior art. FIG. 5 is a timing chart of signal read-out of the image sensor with global shutter of prior art. With reference to FIGS. 4 and 5, on the basis of the traditional pixel structure, the global shutter transistor 401 is added to each of the pixels, which is configured to be controlled by a global shutter (GS) signal. The global shutter transistor 401 is connected to the photodiode 202, so as to control the exposure time of photodiode 402 under the control of GS signal. In the existing image sensor with global shutter, since both the pixel exposure controlled by the GS signal and the read-out controlled by the TX signal are in global mode, when the integration in timing is over (i.e. at the end of the photodiode exposure), the TX is turned on globally, and the signal is firstly stored in the capacitor of FD. With reference to FIG. 5, when the signal is read out, the row selection signal RS is turned on, the pixel signal (i.e. 'signal' signal) is firstly read out. Then the RST signal resets the voltage of FD, and after that, the reset signal (i.e. 'reset' signal) is read out. As the read-out of the pixel signal occurs before the RST signal resets the FD, the two read-outs are not correlated in the full sense. As such, the noise cannot be completely eliminated in the subsequent reverse correlating operation. Consequently, the signal-noise-ratio of the image obtained through the traditional image sensor with the global shutter is descended.

Figure 6:
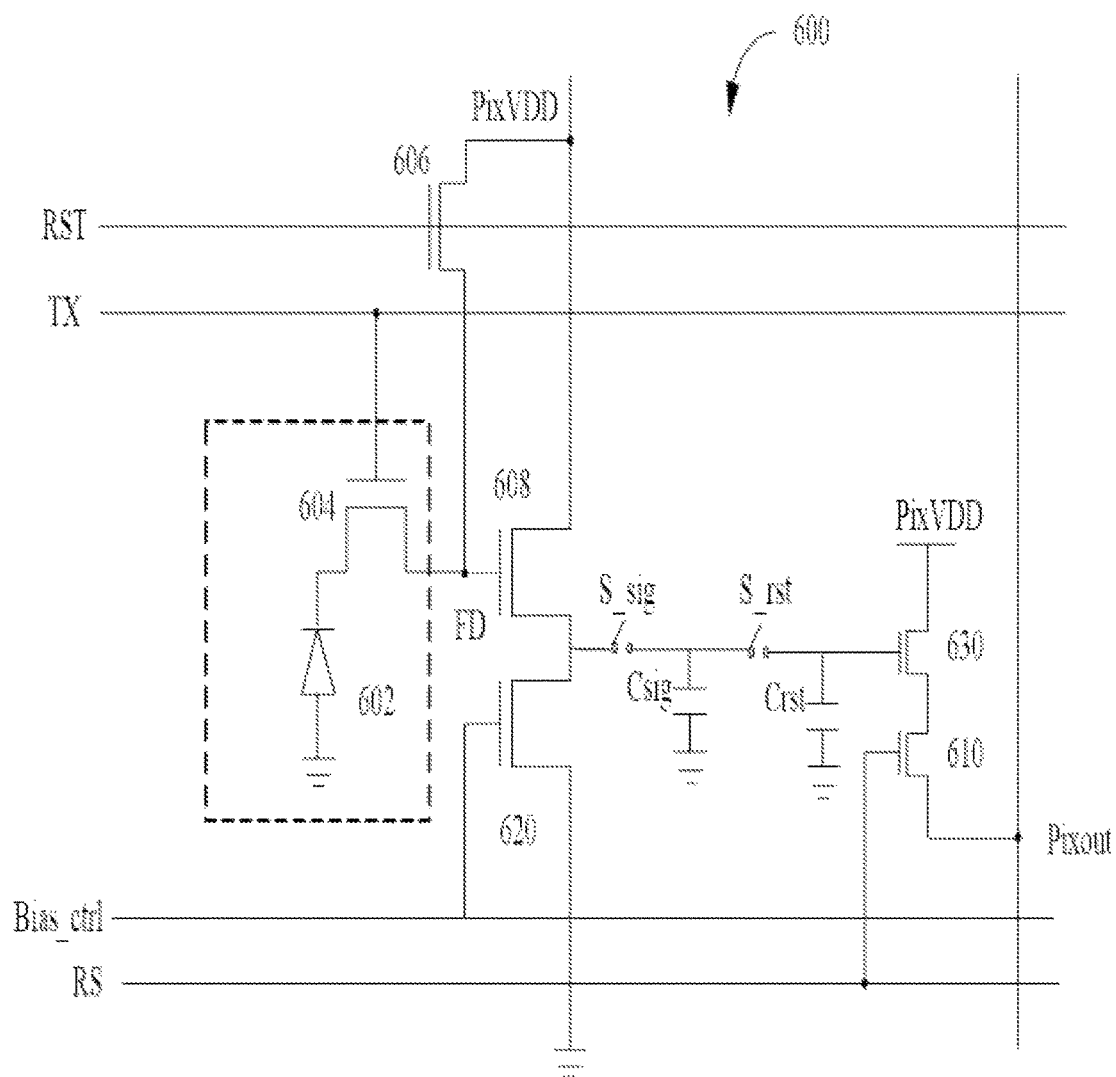
FIG. 6 shows a schematic diagram of a pixel structure in accordance with an exemplary embodiment of the present invention.

FIG. 6 is a schematic diagram of a pixel structure according to one embodiment of the present invention. The functions of the respective elements in FIG. 6 are similar with the functions of corresponding elements in FIG. 4, and their differences are specifically described as follows. As shown in FIG. 6, on the basis of existing pixel structure, a capacitor Crst for storing a 'reset' signal and a capacitor Csig for storing a 'signal' signal are added to the pixel 600. The 'reset' and 'signal' signals after the FD area is reset by the RST signal are respectively stored to the capacitors Crst and Csig, to ensure the correlation of those two signals. With the two storage units of the capacitor Crst and Csig, at the end of the global exposure, the pixel can be read at timing of a full correlation sampling. These two signals will be subtracted from each other in a subsequent column reading circuit to achieve the effect of correlated double sampling (CDS).

According to one embodiment of the present invention, the pixel 600 further comprises an output transistor 620, which is connected between a source follower transistor 608 and the ground, and controlled by a bias control signal Bias_ctrl. When the 'reset' and 'signal' signals are read out and stored to the capacitors Crst and Csig, an output transistor 620 is in turned off state to ensure the storage of the signals. After that, the output transistor 620 grounds the output of source follower transistor 608 to reduce the inference when the 'reset' and 'signal' signals are read out, and to ensure auto-zeroing.

According to one embodiment of the present invention, the pixel 600 further comprises an output source follower transistor 630, which is connected between an output of capacitors Crst and Csig, and a row selection transistor 610, to form a row output circuit so as to provide an output signal.

According to one embodiment of the present invention, the pixel 600 further comprises a reset storage switch S_rst and a reset readout switch R_rst, wherein a reset storage switch S_rst is connected between the output of source follower transistor 608 and the reset storage capacitor Crst, and a reset readout switch R_rst is connected between the reset storage capacitor Crst and the output source follower transistor 630.

According to one embodiment of the present invention, the pixel 600 further comprises a pixel signal storage switch S_sig and a pixel signal readout switch R_sig, wherein a pixel signal storage switch S_sig is connected between the output of source follower transistor 608 and the signal storage capacitor Csig, and a pixel signal readout switch R_sig is connected between the pixel signal storage capacitor Csig and the output source follower transistor 630.

Figure 7:
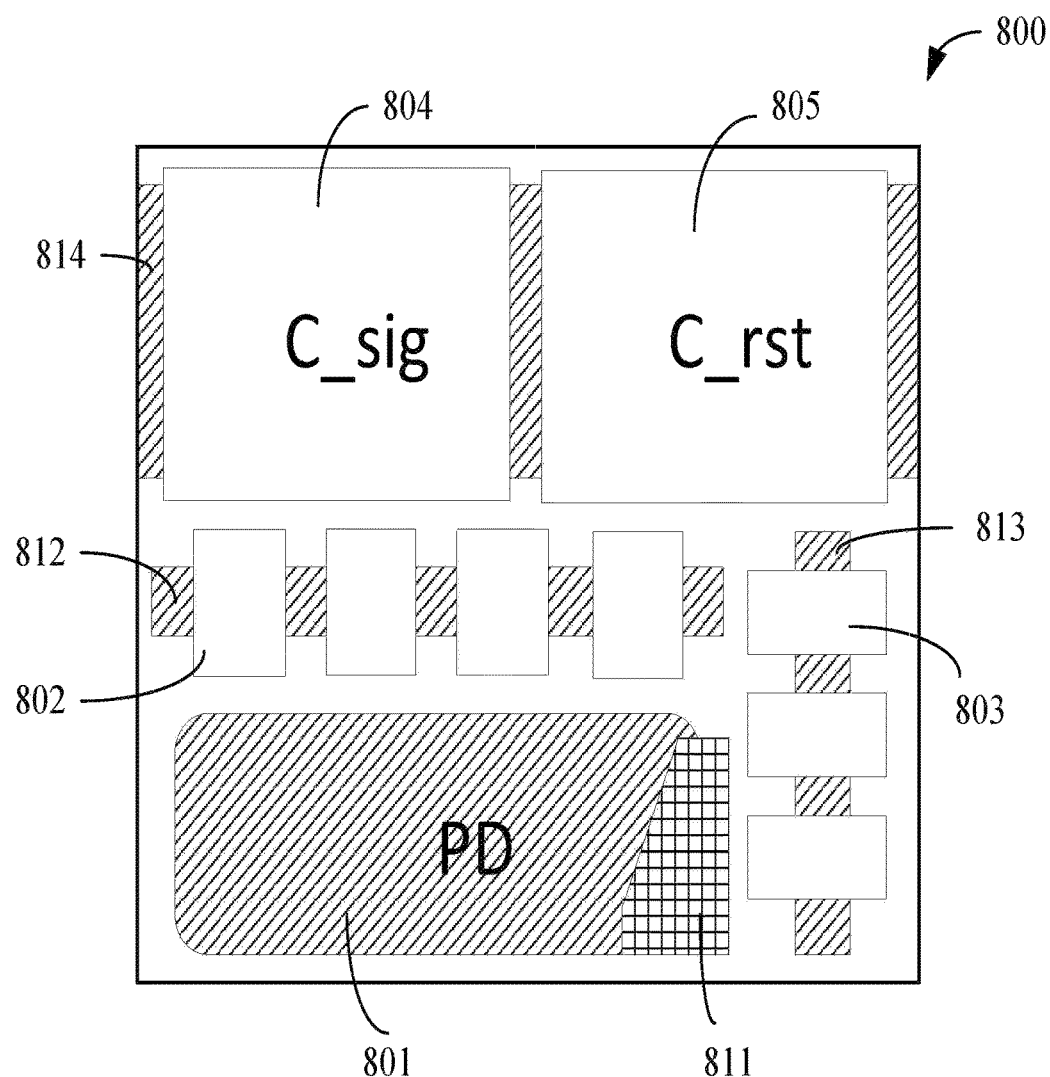
FIG. 7 shows a schematic diagram of a pixel structure in accordance with an exemplary embodiment of the present invention.

FIG. 7 is a schematic diagram of a pixel structure according to one embodiment of the present invention. As shown in FIG. 7, a pixel 800 comprises a photodiode (PD) 801, a plurality of triodes 802 and 803, and an interconnection structure 811-813. A person skilled in the art should understand that FIG. 7 only schematically shows the position and the arrangement of the individual elements. For detailed description of the function and the connection, reference may be made to those shown in FIGS. 1 to 6. According to one embodiment of the present invention, the pixel 800 further comprises capacitors C_sig 804 and C_rst 805, and an interconnection structure 814. Since the arrangement of the capacitors may occupy a large area, the area for the photodiode PD for sensing has to be reduced, and thus the sensing performance of the pixel may be compromised.

Figure 8:
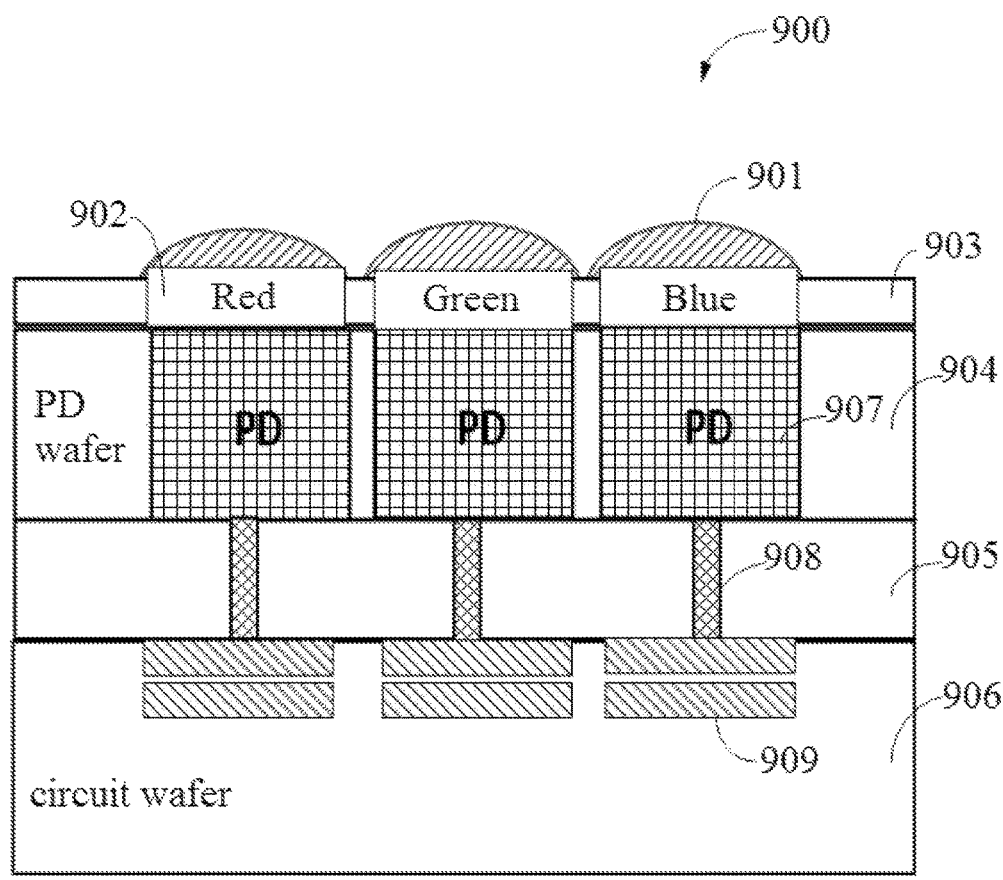
FIG. 8 depicts a schematic diagram of a pixel structure according to another embodiment of the present invention.

FIG. 8 is a schematic diagram of pixel structure according to another embodiment of the present invention. As shown in FIG. 8, a pixel 900 comprises a first spacing layer 903, a first wafer (PD wafer) 904, a second spacing layer 905 and a second wafer (circuit wafer) 906 sequentially. According to one embodiment of the present invention, the pixel 900 further comprises a micro lens 901 located on the first spacing layer. Further, the first spacing layer comprises a plurality of filters 902, which may have three colors of red, green and blue. The first wafer 904 comprises a plurality of photodiodes (PD) 907, and the filters 902 are located between micro lens 901 and PD 907. The second wafer 906 comprises a circuit structure 909 of the pixel, which at least comprises capacitors C_sig and C_rst, as well as other triodes and interconnection structures. The second spacing layer 905 comprises a pixel inner-connection structure 908, which electrically connects the photodiode PD with the circuit structure 909. Therefore, the pixel 900 realizes a layered structure in 3D. The capacitors C_sig and C_rst with large areas are transferred to the second wafer on the bottom layer, and thus the area of the first wafer is saved, so that the photodiode PD can have the area as large as possible, and thus the sensing performance of the whole pixel is enhanced. According to one embodiment of the present invention, the first spacing layer 903 and the second spacing layer 905 may be silicon dioxide. The pixel inner-connection structure 908 may be a metal or a polysilicon.

Finally, it should be explained that, the above embodiments are only used for explaining the technical solution of present invention, and not for limitation thereto. Although the present invention has been explained in details with reference to the preferred embodiments, it should be understood by those skilled in the art that modifications and equivalent alternations can be made to the technical solution of present invention, and these modifications and equivalent alternations cannot depart the modified technical solution from the spirit and scope of the technical solution of present invention.

The invention claimed is:

1. An imaging apparatus, comprising:
   a pixel array, comprising a plurality of pixels arranged in rows and columns, wherein at least one of the pixels comprises:
      a first capacitor configured to store a reset signal, and
      a second capacitor configured to store a pixel signal, and
   a plurality of column circuits, wherein at least one of the column circuits reads the reset signal from the first capacitor, reads the pixel signal from the second capacitor, and generates difference between the reset signal and the pixel signal,
   wherein the pixel is configured to store the pixel signal to the second capacitor after the reset signal is stored to the first capacitor,
   wherein the pixel further comprises an output transistor, which is connected between a source follower transistor and the ground, and controlled by a bias control signal; and when 'reset' and 'signal' signals are read out and stored to the first and second capacitors, the output transistor is in turned off state to ensure the storage of the signals, and after that, the output transistor grounds an output of source follower transistor to reduce the inference when the 'reset' and 'signal' signals are read out, and to ensure auto-zeroing,
   wherein the pixel further comprises an output source follower transistor and a row selection transistor, said output source follower transistor is connected to an output of the first capacitor and the second capacitor and said row selection transistor,
   wherein the pixel further comprises a reset storage switch and a signal storage switch, the reset storage switch being between the signal storgae switch and the first capacitor, and the signal storage switch being connected between the output of the source follower transistor and the second capacitor, and wherein both the first capacitor and the second capacitor are connected to ground; and the imaging apparatus is physically configured that turning the signal storage switch off will disconnect both the first capacitor and the second capacitor from the source follower transistor, and turning the reset storage switch on will connect both the first capacitor and the second capacitor to the output source follower transistor.

2. The imaging apparatus according to claim 1, wherein the pixel comprises a first spacing layer, a first wafer, a second spacing layer and a second wafer sequentially, and wherein the first spacing layer comprises a plurality of filters.

3. The imaging apparatus according to claim 2, wherein the pixel comprises a plurality of micro lens located on the first spacing layer.

4. The imaging apparatus according to claim 3, wherein the first wafer includes a plurality of photodiodes, and the second wafer comprises at least part of circuit of the pixel.

5. The imaging apparatus according to claim 4, wherein the second wafer comprises the first capacitor and the second capacitor.

6. The imaging apparatus according to claim 4, wherein the second spacing layer comprises a pixel inner-connection structure that electrically connects the at least one of the photodiodes located in the first wafer with the at least part of circuit of the pixel located in the second wafer.

7. The imaging apparatus according to claim 4, wherein the first spacing layer comprises a plurality of filters, at least one of which is located between the micro lens and the photodiode.

\* \* \* \* \*